(12) United States Patent
Chang et al.

(10) Patent No.: US 11,780,242 B2
(45) Date of Patent: Oct. 10, 2023

(54) SUBSTRATE POSITIONING FOR DEPOSITION MACHINE

(71) Applicant: Kateeva, Inc., Newark, CA (US)

(72) Inventors: Jerry Chang, Cupertino, CA (US); Matt Audet, Campbell, CA (US)

(73) Assignee: Kateeva, Inc., Newark, CA (US)

( * ) Notice: Subject to any disclaimer, the term of this patent is extended or adjusted under 35 U.S.C. 154(b) by 0 days.

(21) Appl. No.: 17/451,561

(22) Filed: Oct. 20, 2021

(65) Prior Publication Data

US 2022/0126606 A1 Apr. 28, 2022

Related U.S. Application Data

(60) Provisional application No. 63/198,555, filed on Oct. 27, 2020.

(51) Int. Cl.
*B41J 11/00* (2006.01)

(52) U.S. Cl.
CPC .............................. *B41J 11/00218* (2021.01)

(58) Field of Classification Search
CPC ............. B41J 11/00218; B41J 11/0095; H01L 51/0005
See application file for complete search history.

(56) References Cited

U.S. PATENT DOCUMENTS

| | | | |
|---|---|---|---|
| 6,677,975 B1 | 1/2004 | Kerr | |
| 7,127,159 B2 | 10/2006 | Gladnick et al. | |
| 8,865,252 B2 | 10/2014 | Choi et al. | |
| 9,453,282 B2 | 9/2016 | Hong et al. | |
| 2003/0079635 A1 | 5/2003 | Murray | |
| 2003/0155513 A1 | 8/2003 | Remillard et al. | |
| 2003/0234858 A1 | 12/2003 | Kerr | |
| 2005/0158668 A1 | 7/2005 | Bittner et al. | |
| 2005/0235913 A1* | 10/2005 | Prentice | H05K 13/0469 118/712 |
| 2011/0117681 A1* | 5/2011 | Bardos | H01L 22/20 257/E21.526 |
| 2012/0051984 A1 | 3/2012 | Dudenhoefer et al. | |
| 2014/0265046 A1 | 9/2014 | Burris et al. | |
| 2017/0139328 A1 | 5/2017 | Shibazaki | |
| 2018/0015502 A1 | 1/2018 | Zenou | |

FOREIGN PATENT DOCUMENTS

| | | |
|---|---|---|
| EP | 1464507 A1 | 10/2004 |
| WO | 2007098935 A2 | 9/2007 |
| WO | 2014200642 A1 | 12/2014 |

(Continued)

OTHER PUBLICATIONS https://www.prophotonix.com/blog/strobing-machine-vision-lighting/

(Continued)

*Primary Examiner* — Bradley W Thies
(74) *Attorney, Agent, or Firm* — Hauptman Ham, LLP

(57) ABSTRACT

A deposition device is described. The deposition device has a substrate support and an imaging system disposed to image a portion of a substrate positioned on the substrate support. The imaging system comprises an LED light source and an imaging unit, and is coupled to a deposition assembly disposed across the substrate support.

19 Claims, 6 Drawing Sheets

(56) References Cited

FOREIGN PATENT DOCUMENTS

WO 2016067144 A1 5/2016

OTHER PUBLICATIONS

International Search Report and Written Opinion dated Oct. 29, 2020 from International Patent Application No. PCT/US2020/040044.
International Search Report and Written Opinion dated Mar. 2, 2022 from International Patent Application No. PCT/JS2021/072006.
Final Office Action dated Oct. 20, 2022 for U.S. Appl. No. 16/915,614.
Non-Final Office Action dated Apr. 20, 2022 for U.S. Appl. No. 16/915,614 .
Extended Supplementary Search Report dated Jun. 16, 2023 in EP Patent Application No. 20837416.5.

* cited by examiner

SUBSTRATE POSITIONING FOR DEPOSITION MACHINE

CROSS-REFERENCE TO RELATED APPLICATION

This application claims the benefit of U.S. Provisional Patent Application No. 63/198,555, filed Oct. 27, 2021 and is incorporated by reference in its entirety.

FIELD

Embodiments of the present invention generally relate to deposition devices. Specifically, deposition devices having an attached but movable service platform are described.

BACKGROUND

Deposition by Inkjet deposition is common, both in office and home printers and in industrial scale printers used for fabricating displays, deposition of large scale written materials, adding material to manufactured articles such as printed circuit boards, and constructing biological articles such as tissues. Most commercial and industrial inkjet deposition machines, and some consumer printers, use dispensers to apply material to a substrate. The dispenser ejects a controlled quantity of deposition material toward a substrate at a controlled time and rate so that the deposition material arrives at the substrate in a target location and makes a mark having a desired size and shape.

In some cases, such as in the display fabrication industries, very high precision deposition is achieved by depositing very small volumes of material at very precise locations. The volumes may have dimension of 10 µm in some cases and may be deposited in an area of dimension 15 µm. To achieve such precision in placement of materials on a substrate, the substrate must be positioned precisely and/or the position of the substrate must be known precisely. Vision systems using cameras are routinely used to photograph a substrate and determine its position precisely, but capturing the images and processing the images is time consuming. There is a need for a better way to precisely determine the position of a substrate for inkjet printing.

SUMMARY

Embodiments described herein provide a deposition device, comprising a substrate support; and a deposition assembly comprising an imaging system disposed across the substrate support, the imaging system comprising an LED light source.

Other embodiments described herein provide a method of imaging a feature on a substrate, comprising scanning the substrate relative to an imaging system comprising an LED light source and an imaging unit; activating the imaging unit before an extremity of the feature reaches an illumination field of the LED light source; activating the LED light source when a portion of the feature reaches the illumination field; deactivating the LED light source after an active time; and deactivating the imaging unit after an imaging time, wherein the imaging time encompasses the active time.

Other embodiments described herein provide a deposition device, comprising a substrate support; and a deposition assembly comprising an imaging system disposed across the substrate support, the imaging system comprising an LED light source fiber coupled to an optical assembly to direct radiation from the LED light source toward the substrate support; and an imaging unit disposed to capture radiation reflected through the optical assembly.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
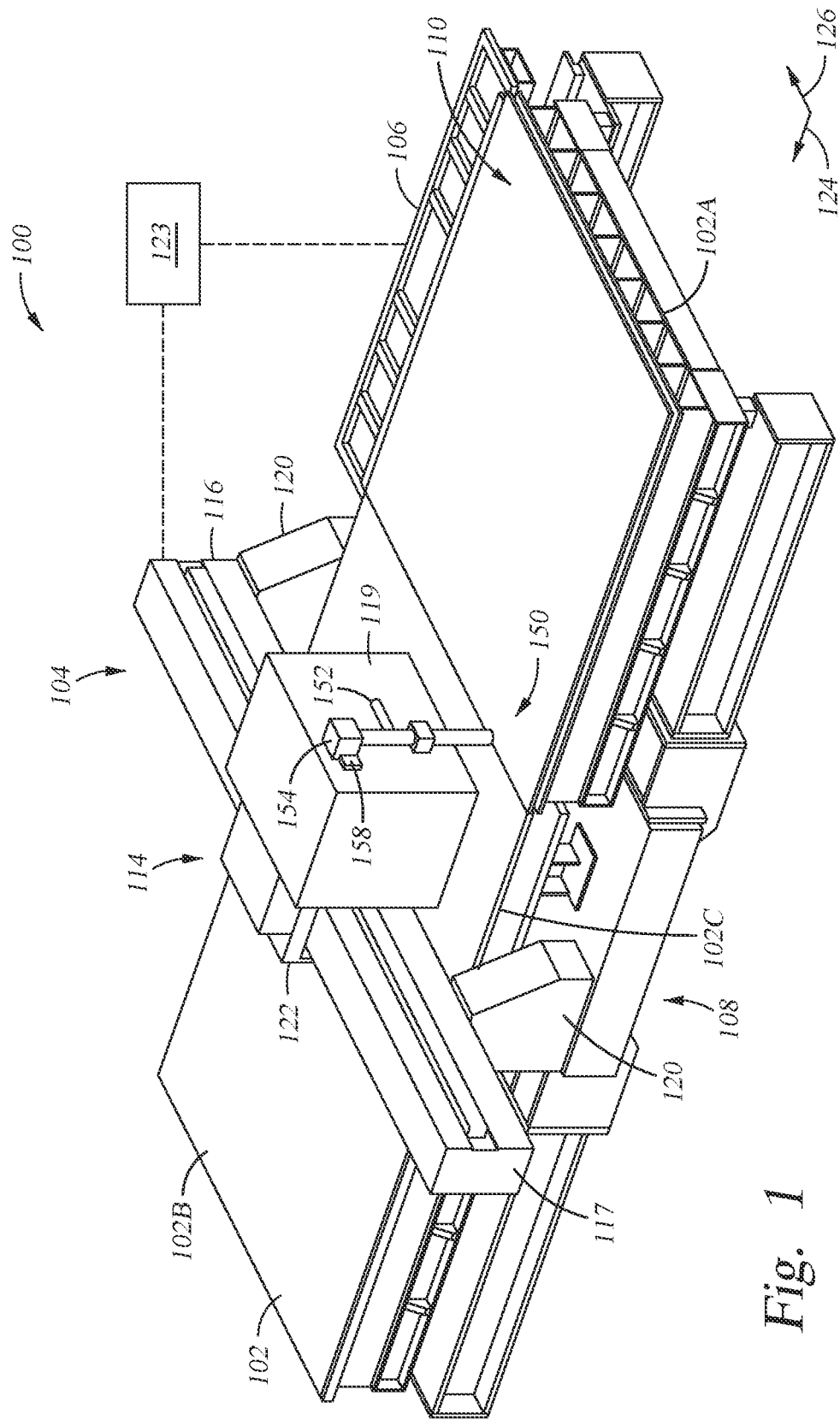
FIG. 1 is an isometric top view of a deposition device according to one embodiment.

A deposition device is described herein with a service platform that can be deployed above the work surface of the deposition device and stowed adjacent to an end of the work surface at an elevation at least partially below a basis elevation of the work surface to allow for substrate loading and unloading. FIG. 1 is an isometric top view of a deposition device 100 according to one embodiment. The deposition device has a substrate support 102, a deposition assembly 104, and a holder assembly 106 for manipulating a substrate for deposition. The deposition device 100 includes a base 108, which is typically a massive object to minimize vibratory transmissions to the operative parts of the deposition device 100. In one example, the base 108 is a granite block. The deposition assembly 104 includes a deposition assembly support 116 comprising a stand 120 on each side of the base 108 and a rail or beam 117 extending between the stands 120 across the substrate support 102.

The substrate support 102 has a first section 102A, a second section 1028, and a third section 102C between the first and second section 102A and 1028. The first and second sections 102A and 102B are staging areas for substrates entering and leaving the deposition device 100, while the third section 102C is a work section for positioning the substrate for processing relative to the deposition assembly support 116. The substrate support 102 has a work surface 110 along with means for making the work surface 110 substantially frictionless. Here, the work surface 110 is a gas cushion table that provides a gas cushion, for example air, oxygen depleted air, dry air, nitrogen, or other suitable gas on which the substrate floats. The work surface 110 features a plurality of holes (not shown) that allow jets of gas to exit, thus providing an upward force to maintain a substrate at a desired elevation above the work surface 110. Some of the holes may also allow controlled withdrawal of gas from the gas cushion floating the substrate support to provide precise local control of substrate elevation. In one embodiment, the third section 102C has gas providing holes and gas withdrawing holes. The gas providing and withdrawing holes provide independent control of gas in the gas cushion and therefore substrate float height above the substrate work surface 110.

The deposition assembly 104 comprises a dispenser assembly 114 coupled to the beam 117. The dispenser assembly 114 includes a dispenser housing 119 coupled to a deposition carriage 122 that rides along the beam 117 to position the dispenser assembly 114 in relation to a substrate disposed on the third section 102C of the substrate support 102. The dispenser housing 119 contains one or more dispensers (not shown) that eject volumes of deposition material onto a substrate positioned on the substrate support 102 under the deposition assembly 104.

In operation, a substrate is positioned under the deposition assembly 104 by the holder assembly 106. The holder assembly 106 acquires secure contact with the substrate upon loading and moves the substrate along the substrate support 102 to position the substrate with respect to the deposition assembly 104 for dispensing print material onto the substrate in a precise fashion. The holder assembly 106, in this case, generally extends along the substrate support 102 in a first direction to translate the substrate in the first direction during deposition. The first direction is denoted in FIG. 1 by arrow 124. The dispenser assembly 114 generally moves in a second direction substantially perpendicular to the first direction, as defined by the beam 117, which extends substantially in the second direction, denoted in FIG. 1 by arrow 126. The second direction 126 is sometimes referred to as the "x direction," and the beam 117 as the "x beam."

A controller 132 is operatively coupled to the holder assembly 106 and the deposition assembly 104 to control movement of, and deposition onto, a substrate positioned on the substrate support. The controller 132 may directly control actuators of the holder assembly 106 and the deposition assembly 104, or the controller 132 may be operatively coupled to a holder assembly controller coupled to the holder assembly 106 and to a deposition assembly controller coupled to the deposition assembly 104. The controller 132 controls movement and positioning of the substrate, if any, on the substrate support 102. The controller 132 also controls movement of the dispenser assembly 114 along the beam 117 and ejection of deposition material from the dispenser assembly 114 onto the substrate.

An imaging system 150 is coupled to the dispenser assembly 114. The imaging system 150 includes an LED light source 152 and an imaging unit 154. The LED light source 152 directs radiation toward a substrate positioned on the substrate support 102 positioned under the dispenser assembly 114. The imaging unit 154 detects illuminating radiation reflected from the substrate. The imaging unit 154 can include a digital camera or other high precision imaging capture component. The imaging unit also include optics for focusing the radiation into the image capture component. The LED light source 152 and imaging unit are arranged such that the LED light source 152 provides an illumination field on the substrate that is within the imaging field of the imaging unit 154.

The LED light source 152 may emit radiation that is selected to minimize impacts on other aspects of the deposition device 100 and the processes performed by the deposition device 100. For example, in many cases, curable materials are deposited on a substrate using the deposition device 100. Such materials are routinely curable using short-wavelength electromagnetic radiation, such as ultraviolet radiation. These materials are also, frequency, sensitive to short-wavelength visible radiation, and can have minor sensitivity to longer-wavelength visible radiation. Because uniform processing can be important to achieving the high precision results in industries such as the display fabrication industry, the LED light source can be selected to emit long wavelength radiation to minimize any impact on deposition materials. Light sources having emission wavelengths of 650 nm or more are useful in this regard. In one example, the light source has emission wavelength of 650 nm. In another example the light source has emission wavelength of 800 nm.

The LED source can be an array of LEDs selected to provide a desired illumination field that enables the imaging system to capture an image in a very short time. Imaging in a very short time enables capturing clear images of an area of a moving substrate. The combination of light source and image capture component can also be selected to maximize sensitivity of the image capture component to the radiation emitted by the LED light source. For example, a Dalsa Nano M2020 camera has near-peak sensitivity at a wavelength of 650 nm. Silicon-based NIR image capture units typically have peak sensitivity around 800 nm. LED light sources can be used that have emission spectra that peak at or near these wavelengths.

The LED light source 152 can be fiber coupled to translate the LED light emission to an emission plane that can be located close to the substrate. Use of LED light sources provides high luminosity and fast transition to and from peak luminosity without the need to decorrelate laser light. For many display applications, a substrate has a positioning feature, such as a fiducial mark, that can be used to precisely calibrate the position of the substrate. The mark may be small, for example 0.5-5 mm in dimension. In some cases, the mark has a cross-shape. The fiber coupling allows the radiation emission plane to be positioned such that the radiation produces a uniformly bright spot that encompasses all, or a substantial part of, the view field needed to ascertain the position of a mark.

The imaging system 150 is configured to capture an image while the substrate and the dispenser assembly 114 move relative to one another. The relative movement can be as fast 1 m/sec in some cases. An imaging controller 158 is operatively coupled to the LED light source 152 and the image capture unit 154 to drive image capture while relative movement is underway. Here, the LED light source has a pulse capability at least as short as a few µsec, meaning that the average intensity of the emitted radiation field increases, reaching half its maximum value at a pulse start time, and decreases, reaching half its maximum value at a pulse end time, in a pulse duration, defined as the duration from the pulse start time to the pulse end time, of a few µsec, or even less than 1 µsec in some cases. The imaging controller 158 is realized in a printed circuit board containing the digital circuitry that communicates instructions to the image capture unit 154 to start and stop image capture and to a power source or a switch electrically coupled between the power source and the LED light source 152 to switch on and switch off, or alternately to emit a pulse having a defined duration. The imaging controller 158 is operatively coupled to the controller 132, and optionally to other controllers such as holder assembly controllers and dispenser assembly controllers, to send and receive signals representing information used to control imaging of the substrate. The imaging controller 158 is configured to send signals representing images captured by the imaging capture unit 154 to the controller 132 for analysis. The imaging controller 158 is also configured to control the image capture unit 154 and the LED light source 152 to capture an image when a feature of the substrate, such as positioning feature, is expected to be within the field of view of the image capture unit 154, based on information received, such as expected position of the feature and movement rate of the substrate, from the controller 132.

The LED light source is electrically coupled to a power supply configured to provide voltage to the LED light source that results in a desired luminosity for imaging in the durations described above. A number of LED emitters in the LED light source may be selected to provide total lumens for capturing a clear image in the short durations described above. In one example, the LED array may be an array of 24 LEDs having emissions at 610-650 nm, each LED having luminous output of about 65 lumens at an applied voltage of about 1.8 V. LEDs that may be used include the LUXEON® Star LXZ1-PHO1 LEDs available from Lumileds, of San Jose, Calif. In one case, 40 such LEDs are assembled into a 5×8 array. In another case, 24 such LEDs are assembled into a 4×6 array. In other cases, 40 LEDs can be assembled into a circular profile. In still other cases, more LEDs can be used. For example, in one case, 50 LEDs can be used for a light source.

Figure 2:
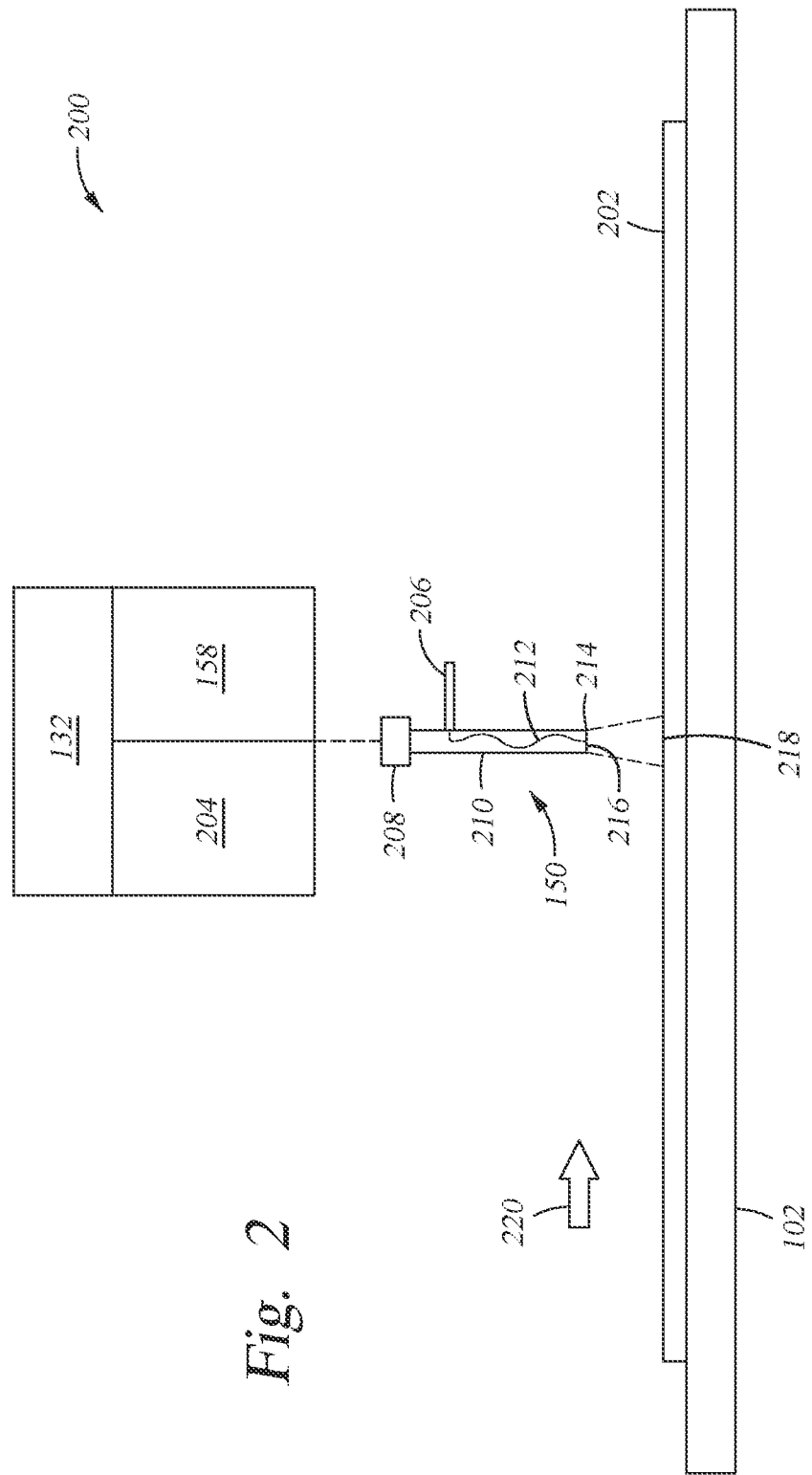
FIG. 2 is a block diagram of a position acquisition system according to one embodiment.

FIG. 2 is an elevation view of a position acquisition system 200 according to one embodiment. The position acquisition system 200 comprises the imaging system 150, with a substrate 202 disposed on the substrate support 102 for processing. The imaging system 150 is operatively coupled to the imaging controller 158, which is further operatively coupled to the system controller 132, as described above. The imaging system 150 may also be operatively coupled to a positioning controller 204 that can control and adjust the position of the imaging system 150. The positioning controller 204 may adjust the position of the imaging system 150 with respect to the dispensers of the dispenser housing 119 of FIG. 1.

In this case, the imaging system 150 includes a LED light source 206 and an imaging unit 208. An optical assembly 210 optically couples the LED light source 206 and the imaging unit 208 to the substrate 202 for imaging. The optical assembly may include one or more lenses, prisms, fibers and/or mirrors for directing and/or focusing light reflected from the substrate into the imaging unit 208. An optical fiber 212 translates the radiation emitted by the LED light source 206 to an emission point 214, which may be at an end of the optical assembly 210 distal to the substrate support 102, may extend beyond the end of the optical assembly 210 to a location closer to the substrate support 102 than the end of the optical assembly 210, or may be recessed within the optical assembly 210. The optical fiber 212 is supported by a support 216 that maintains a position of the emission point 214. Radiation is emitted from the optical fiber 212 at the emission point 214 and traverses a gap between the emission point 214 and the substrate 202 to provide an illumination field 218. Dimension of the illumination field 218 can be controlled by controlling location of the emission point 214 with respect to the substrate 202. During processing, the substrate is typically scanned with respect to the imaging system 150 to illuminate portions of the substrate to be imaged, as indicated schematically by the arrow 220. The LED light source 206 is activated at times when the portion of the substrate to be imaged is partially or completely within the illumination field 218 as the relative scanning is performed, and deactivated when the portion to be imaged has traversed the illumination field 218 for a time sufficient to capture the desired image of the entire area to be imaged. This may be when a first portion of the area to be imaged exits the illumination field 218, or when a last portion of the area to be imaged exits the illumination field 218. The LED light source 206 can be activated by closing a switch electrically coupled between a power source (not shown) and the LED light source 206. The switch may be controlled by signals sent from the controller 123 (FIG. 1) or by a local controller for the LED light source 206, or a combination thereof.

Figure 3:
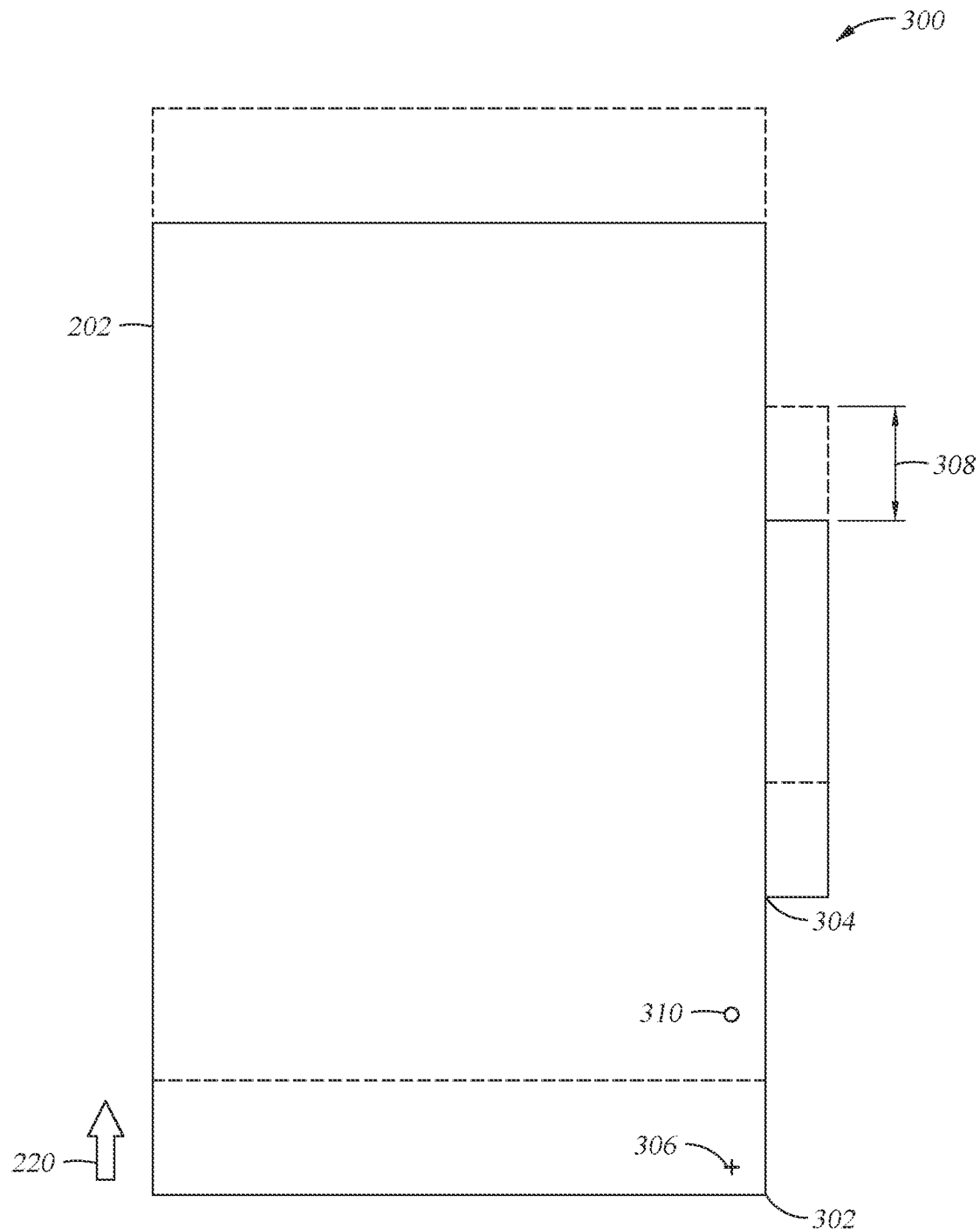
FIG. 3 is an algorithm diagram of a droplet ejection algorithm according to one embodiment.

FIG. 3 is an algorithm diagram of an image capture control algorithm 300 according to one embodiment. The image capture control algorithm 300 is used with deposition devices such as the device 100. The image capture control algorithm 300 creates triggers for initiating image capture of a feature on a substrate 301 by an image capture unit and for initiating illumination by an illumination unit. The illumination unit is capable of generating short pulses of uniform radiation within an illumination field. The duration of the pulses is around 1 μsec, or shorter, to enable capturing images of a small feature on a substrate at relative rates of motion of up to 1 m/sec. An LED light source, for example an array of LED sources having emission wavelength matched to a spectral sensitivity of the image capture unit and luminous output sufficient to enable capture of clear images during the short exposure durations described above, can be used.

The algorithm 300 uses a position markers, along with position signals from the substrate holder to determine when to begin image capture by the image capture unit and when to begin illumination by the illumination source. Generally the algorithm uses a defined coordinate system that is used by the controller to perform the algorithm 300. The substrate has a defined origin point 302, which is positioned at a known position $(x_S, y_S)$ relative to a home position 304 of the holder $(x_H, y_H)$, which is also known. A design location 306 of a feature on the substrate $(x_F, y_F)$ is known relative to the origin point 302 of the substrate. In an embodiment where the substrate is moved in the y-direction during processing, the y-position of the holder, substrate origin, and feature are $y_h$, $y_s$, and $y_f$, respectively. These are offset from their various home positions in the y-direction by an identical distance 308. If the imaging system is moved during processing, the position of the illumination field 310 at any time is $y_i$. The feature has design dimension of $\Delta x_F$ and $\Delta y_F$. The illumination field 310 produced by the imaging system has a known location $(x_I, y_I)$ relative to the holder home position. The illumination field also has dimensions $\Delta x_I$ and $\Delta y_I$. Thus, in the y-direction, the illumination field extends from $y_I - \frac{1}{2}\Delta y_I$ to $y_I + \frac{1}{2}\Delta y_I$, or if the imaging system is moved, $y_i - \frac{1}{2}\Delta y_1$ to $y_i + \frac{1}{2}\Delta y_I$. At any time during a process, the holder y-position $y_h$ is known from actuator position.

The various position markers are provided to a controller, such as the controller 132. The algorithm determines when to activate the image capture unit and the illumination source to capture an image of the feature, based on the expected location of the feature. The size of the illumination field is set to provide sufficient coverage that any offset between the expected position of the feature and the actual position of the feature is less than an amount that keeps the entirety of the feature in the illumination field during the exposure.

Let relative movement velocity of the substrate and the imaging system in the y-direction be v, and let pulse duration be t. The algorithm computes a light-on event to illuminate the feature 306. The light-on event may be computed when the entire feature 306 is within the illumination field 310. This occurs when, in the y-direction, $y_f-\frac{1}{2}\Delta_F=y_i-\frac{1}{2}\Delta y_I$. If the holder position is offset in the y-direction relative to the substrate origin by $y_{HS}$ then the holder position at light-on time is $y_i-\frac{1}{2}\Delta y_I-y_f+\frac{1}{2}\Delta y_F+y_S+y_{HS}$. The light-on event can be computed in terms of holder position, time, or any other parameter that can be determined from the parameters of the deposition job. If the light-on event is rendered as a time, it will be the time at which $vt=y_i-\frac{1}{2}\Delta y_I-y_f+\frac{1}{2}\Delta y_F$.

The duration light is on is minimized to avoid distortion of the image. The substrate and the imaging system may be relatively moving when the image is captured. Illuminating the scene longer than necessary to capture the desired image could result in reduction in the clarity of the image. The algorithm computes a light-off event when, after the light-on event, the feature has traversed the illumination field. This occurs when, in the y-direction, $y_f+\frac{1}{2}\Delta y_F=y_i+\frac{1}{2}\Delta y_I$. The algorithm 300 can compute light-off holder position as $y_i+\frac{1}{2}\Delta y_I-y_f-\frac{1}{2}\Delta y_F+y_S+y_{HS}$ or the time at which $vt=y_i+\frac{1}{2}\Delta y_I-y_f-\frac{1}{2}\Delta y_F$. The duration of the pulse is selected to be the time for the feature to transit the illumination field, which is $$t = \frac{1}{v}(\Delta y_I - \Delta y_F).$$

The imaging system is positioned such that the x-position of the illumination field is the same as the designed x-position of the feature. The imaging system uses illumination sources that can transition from zero to peak intensity, and from peak intensity to zero, in a time much less than the pulse duration. LED light sources can be transitioned as quickly as electric potential across each LED light source can be transitioned, so LED light sources can be pulsed in the short durations described herein. LED light sources also emit uniform radiation that, in most cases, does not need further uniformizing to enable clear images.

Figure 4:
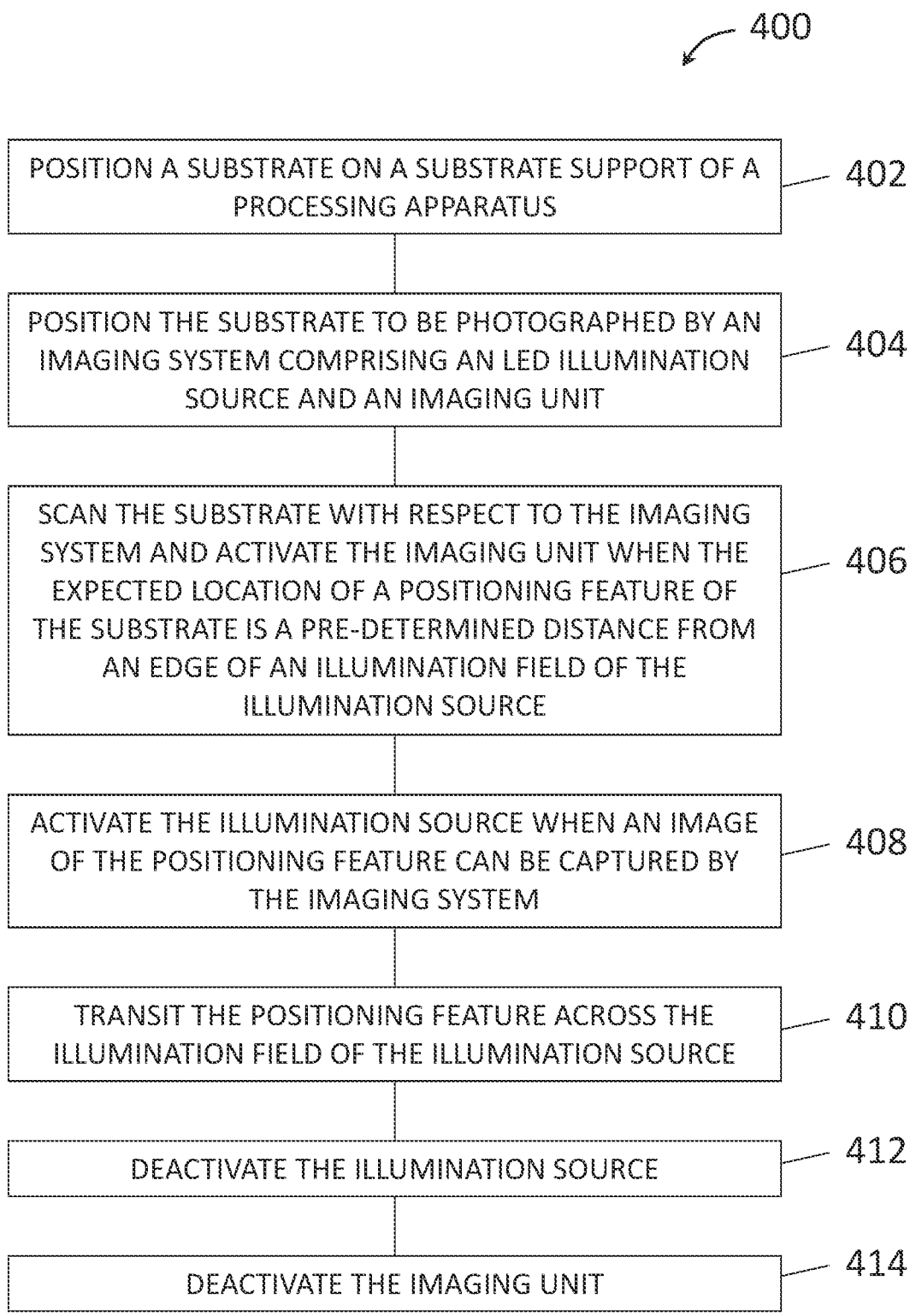
FIG. 4 is a flow diagram of a method according to one embodiment.

FIG. 4 is a flow diagram summarizing a method 400 of capturing an image of a position feature on a substrate. At 402, a substrate is positioned on a substrate support of a processing apparatus. Typically the processing apparatus is used to perform a process, such as material addition to, or removal from, the substrate, and positioning features of the substrate are used to guide the process. The position feature may be a special feature, such as a mark or structure, added to the substrate specifically for positioning the substrate, or the position feature may be a feature added to the substrate for some other purpose and used here for positioning the substrate.

At 404, the substrate is positioned to be photographed by an imaging system. The substrate can be moved into position with respect to the imaging system by applying a substrate holder to move the substrate. In some cases, the substrate support includes a frictionless surface such that the substrate holder can move the substrate with little resistance. The imaging system can also be moved in some cases. For example, the imaging system may be deployed on a positioning system using an air bearing coupled to a rail. The imaging system may include an LED light source oriented to direct illuminating radiation toward an imaging area. An imaging unit is positioned proximate to the LED light source to image radiation reflected from the substrate.

The substrate is positioned for imaging at a location determined by an expected location of the positioning feature. The expected location of the positioning feature is a pre-determined location on the substrate where the positioning feature is expected to be found. The imaging system and the substrate are mutually positioned such that the expected location is near an illumination field of the illumination source.

At 406, the substrate is scanned with respect to the imaging system. The expected location of the positioning feature is moved toward an edge of the illumination field of the illumination source. When the expected location is at a pre-determined distance from the edge of the illumination field, the imaging unit is activated to begin acquiring image data. At this time, the illumination source is not active. Typically, the processing apparatus has an enclosure that isolates the substrate support and imaging system, so any light source other than the illumination source is minimal.

At 408, the illumination source is activated when an image of the positioning feature can be captured by the imaging unit. The illumination source may be activated when a portion of the positioning feature is expected to enter the illumination zone, when a fraction of the positioning feature inside the illumination field of the illumination source is expected to be at a maximum, or when the entire positioning feature is initially expected to be within the illumination field of the illumination source. In one case, the illumination source is activated when a leading edge of the positioning feature is expected to reach an edge of the illumination field. The expected position of the positioning feature may be at an extremity of the positioning feature, or at a center of the positioning feature. If the expected position of the positioning feature is at an extremity thereof, the illumination source can be activated when the expected position of the positioning feature is expected to reach the edge of the illumination field. If the expected position of the positioning feature is at a center thereof, a known dimension of the positioning feature can be used to determine an expected position of an extremity of the positioning feature, and the illumination source can be activated when the expected position of the extremity of the positioning feature is expected to reach the edge of the illumination zone.

In other cases, the illumination source can be activated when the positioning feature, or a large portion thereof, is expected to be entirely within the illumination field of the illumination source. In this case, the illumination source is activated when a trailing edge of the positioning feature is expected to reach the edge of the illumination zone, as determined by the known geometry and expected location of the positioning feature. Waiting until a maximum portion, or all, of the positioning feature is within the illumination field of the illumination source to activate the illumination source minimizes exposure time for capturing the image, and therefore minimizes movement of the substrate during image capture. Minimizing movement of the substrate during image capture results in the sharpest image.

At 410, the substrate and imaging system are mutually scanned such that the positioning feature, or a portion thereof, transits the illumination field of the illumination source during a transit time. The transit time may be defined in a number of ways. In one case, the transit time is a time between when a first extremity of the positioning feature enters the illumination field of the illumination source and the last extremity of the positioning feature exits the illumination field of the illumination source. In another case, the transit time is a time between when a last extremity of the positioning feature enters the illumination field, wherein the positioning feature has no other extremities that enter the illumination field thereafter, and a time when a first extremity of the positioning feature exits the illumination field. In either case, all or only a portion of the positioning feature may transit through the illumination field. The time during which the transit takes place may be as little as 1 μsec. The transit time can be determined using a known dimension of the illumination field and by the velocity of transit.

At 412, the illumination source is deactivated. An active time of the illumination source is defined as the time between when the illumination source is activated and when the illumination source is deactivated. The active time of the illumination source may be the same as the transit time, or different. The active time of the illumination source may be coincident and simultaneous with the transit time, may overlap with the transit time, or may encompass the transit time. In one case, the active time is coincident and overlapping with the transit time. In another case, the active time is coterminous and overlapping with the transit time. In yet another case, the active time is concurrent with the transit time, and can overlap with the transit time or encompass the transit time. In any event the active time and transit time are related to illuminate a desired portion of the positioning feature during the transit time.

In the event an image of the entire positioning feature is desired, but cannot be captured in a single exposure, due for example to the size of either the illumination field of the illumination source or the size of the imaging field of the imaging unit, the substrate and imaging system can be repositioned for a second exposure to capture an additional portion of the positioning feature in a manner similar to the method 400.

At 414, the imaging unit is deactivated. An imaging time can be defined as the time between when the imaging unit is activated and when the imaging unit is deactivated. The imaging time is longer than the active time of the illumination source, since obtaining short light pulses is more straightforward than obtaining useful exposures with short exposure times. In the embodiments described herein, the positioning features may have dimension on the order of 1 μm, and scan velocity of the substrate may be as much as 1 m/sec. Thus, in some cases images are captured in a duration of 1 μsec using the methods and apparatus described herein. Such short duration exposures are more readily accomplished using a short active time of 1 μsec with a longer imaging time of 1 msec or more.

The method 400 may be repeated to image a plurality of positioning features. In each case, an expected position of the positioning feature is known, and the substrate and imaging system are positioned to place the expected position near the illumination field of the illumination source. It should be noted that, due to errors in placement of the substrate, errors in placement of the imaging system, errors in application of the positioning features to the substrate, and thermal displacements and distortions, an image taken using the expected location of the positioning feature may not capture the desired image. In such cases, the captured image can be analyzed to determine magnitude and direction of a position correction that can be applied. The method 400 can then be repeated, applying the position correction before or during performance of the method 400. Typically the expected position of the positioning feature is modified by the position correction prior to repeating the method 400, but a bias can also be applied to the position of the substrate and/or the imaging system in addition to, or instead of, modifying the expected position of the positioning feature.

Figure 5:
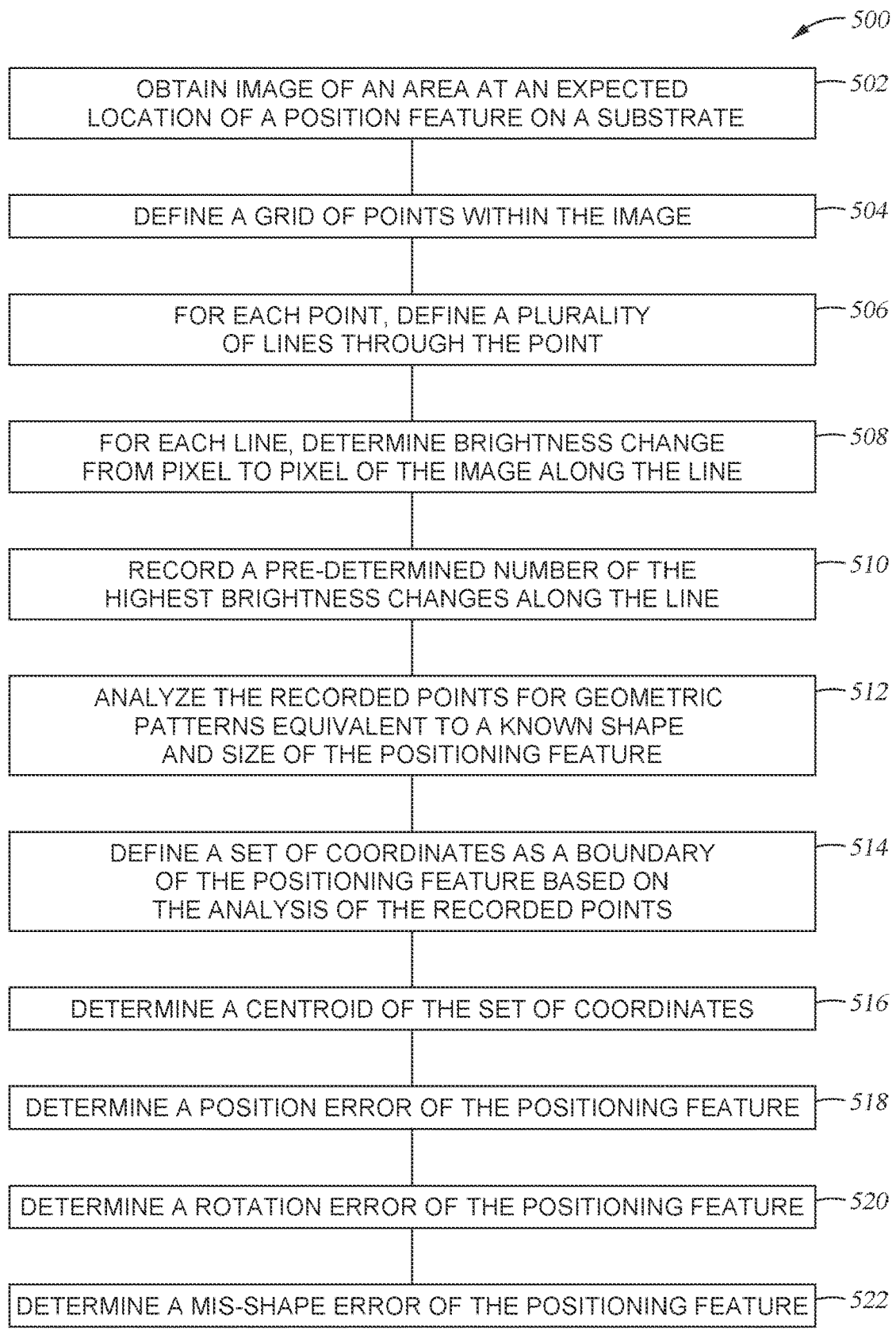
FIG. 5 is a flow diagram summarizing a method that can be used with the apparatus and other methods described herein.

FIG. 5 is a flow diagram summarizing a method 500 that can be used with the apparatus and other methods described herein. The method 500 is a method of determining position and orientation of a positioning feature of a substrate from a pulse-illuminated image. At 502, an image of an area of a substrate is obtained at a location where a positioning feature is expected to be found. The image is obtained using the imaging system described herein.

At 504, a set of grid points is defined within the image. The grid points are defined by x-y coordinates in a common coordinate system with points in the image. That is, the image is taken by locating the imaging system at a point defined by coordinates. The geometry of the imaging system determines the coordinates of the boundaries of the image in the coordinate system. The grid points are defined between the coordinates of the boundaries of the image. Any number of grid points may be used, with more grid points being helpful when the positioning feature has a more complex shape.

The expected shape and size of the positioning feature is typically also defined by coordinates in the same coordinate system. For example, vertices of a polygonal positioning feature can be defined by an ordered set of coordinate pairs, where adjacent coordinate pairs define the locations of vertices connected by edges. For non-polygonal shapes having curved contours, the coordinates may define adjacent points on edge contours of the shape. More points in the shape definition of such a shape improve the shape definition by minimizing the error of assumed straight edges between neighboring points.

At 506, for each grid point defined at 504, a plurality of lines is defined through the grid point. The lines can be defined as a set of coordinate pairs representing each pixel of the image along the lines, or the lines can be defined as a set of end points. The number of lines is pre-determined based on the complexity of the shape being imaged, and may be increased if a first performance of the method 500 yields unsatisfactory definition of the positioning feature in the image. The lines are generally selected to cover a plane uniformly, for example radiating at equal angles from the origin point.

At 508, for each line defined at 506, a brightness change from pixel to pixel of the image along the line is determined. For each pixel $P^1$ on the line, defined by a coordinate pair $(x_{P^1}, y_{P^1})$ belonging to the set of coordinate pairs defining the line, the brightness of the pixel $B_{P^1}$ is ascertained. The brightness $B_{P^2}$ of at least one neighboring pixel $P^2$ on the line, at coordinates $(x_{P^2}, y_{P^2})$ is also ascertained. The two brightnesses are subtracted, $B_{P^2}-B_{P^1}$ to determine brightness change at pixel $P^1$. Absolute value is typically used. This type of brightness change is "forward" brightness change. Alternately, "backward" brightness change, where $P^1$ is compared to the preceding pixel $P^0$, or "central" brightness change, where average brightness change from $P^0$ to $P^1$ to $P^2$, can be used.

Brightness change is generally used to indicate where a boundary may be located in the image. At 510, a pre-determined number of the highest brightness change pixels, points along the line having the highest magnitudes of brightness change, are recorded as candidates for a shape boundary within the image. Operations 506, defining lines, 508, analyzing brightness changes along the lines, and 510, recording the largest magnitude brightness changes, are repeated for all grid points defined for the image. From this process, a set of points is acquired representing candidate points for defining the edge of the shape captured in the image.

At 512, the recorded points are analyzed to determine which points lie on the boundary of the image of the positioning feature. Any number of shape recognition algorithms can be used to determine which points can be used to define the location of the boundary edge of the shape in the image. Selection of the algorithm can be influenced by the known shape of the positioning feature. For example, if the shape is known to be circular, or nearly so, equality of distance from a point can be used as a search criteria. For more complex shapes, distance based signatures can be computed in a matching algorithm. For example, test shapes bounded by the known shape and dimension of the positioning feature can be defined by coordinates, and distances of the recorded points from the test shape can be determined. The test shape can then be sought, within the constraints of the known shape and dimension, which minimizes the distance statistic. The result of such search can be improved by excluding statistical outliers to resolve a "best" score for each test shape, and the test shape with the best overall score can be identified as the likeliest representation of the shape in the image.

From such a best test shape, further refinement of the shape can be performed. For example, if the test shape has boundaries defined by coordinate pairs of pixels on the boundary, curvature metrics can be applied pixel by pixel to improve the test shape fit to the recorded points. At 514, a set of coordinates is defined as representing a boundary of the positioning feature in the image based on the analysis of 512.

After the boundary of the positioning feature in the image is defined in coordinates, characteristics of the positioning feature in the image can be determined. At 516, a centroid of the coordinates defining the boundary of the positioning feature can be computed as the "center" of the feature. This location can be recorded in the system as the actual location of the positioning feature on the substrate. Alternately, a maximum or minimum x-value and a maximum or minimum y-value can be used as the location of the positioning feature. When the position is defined at 516, a position error of the positioning feature can be determined at 518. The position error is the difference between the coordinates of the positioning feature as defined from the image analysis and the expected coordinates of the positioning feature. This position error can be used to adjust processing plans for the substrate.

At 520, a rotation error can be defined for the positioning feature. A rotation transformation can be applied to the coordinate set defining the boundary of the positioning feature in the image. For example, a rotation angle can be defined in radians, and an x-y shift of each pixel in the coordinate set defining the boundary of the positioning feature in the image can be defined based on radial coordinates of each pixel. After applying the rotation transformation, a difference between the rotated coordinate set of the image boundary and the expected coordinate set of the positioning feature boundary can be computed. The degree of rotation that minimizes the difference can be used as the rotation error of the image. The rotation error may be computed before or after adjusting for any position error identified at 518.

At 522, a mis-shape error can be defined for the positioning feature. The mis-shape error documents distortion of the positioning feature from its expected shape. The mis-shape error, if not detected and compensated, can drive processing errors introduced based on the assumption that the positioning feature is shaped properly. For example, if one corner of a square positioning feature is misplaced, such that the positioning feature is not quite square, the positioning feature may be found and located, but it's location may be mis-recorded for the processing system based on the mis-shape. The mis-shape error is typically determined after compensating for any position error and rotation error. A pixel-by-pixel error of the position- and rotation-compensated image can be computed and recorded as the mis-shape error. The recorded location of the positioning feature, for purposes of processing the substrate, can be adjusted based on the identified mis-shape error.

The method 500 can be used to locate and define a plurality of positioning features of a substrate. Errors detected in a plurality of positioning features can be analyzed to identify systematic errors in placement and orientation of a substrate in the processing system. For example, similar rotation or position errors among a plurality of positioning features can indicate an overall rotation or position error in placement of the substrate. Different rotation or position errors can indicate distortion of a substrate, or misplacement of positioning features on the substrate. The method 500, and variations thereof, are performed using a digital processing system programmed with instructions appropriate to render the various coordinates and calculations referred to in the method 500. The digital processing system accepts data representing the image from the imaging unit, and automatically identifies the boundaries of the feature in the image, and optionally the position error, the rotation error and the mis-shape error of the positioning feature in the image. The results of the method 500 can be used to control precision deposition of material onto a substrate using, for example, the deposition apparatus 100 of FIG. 1.

Figure 6:
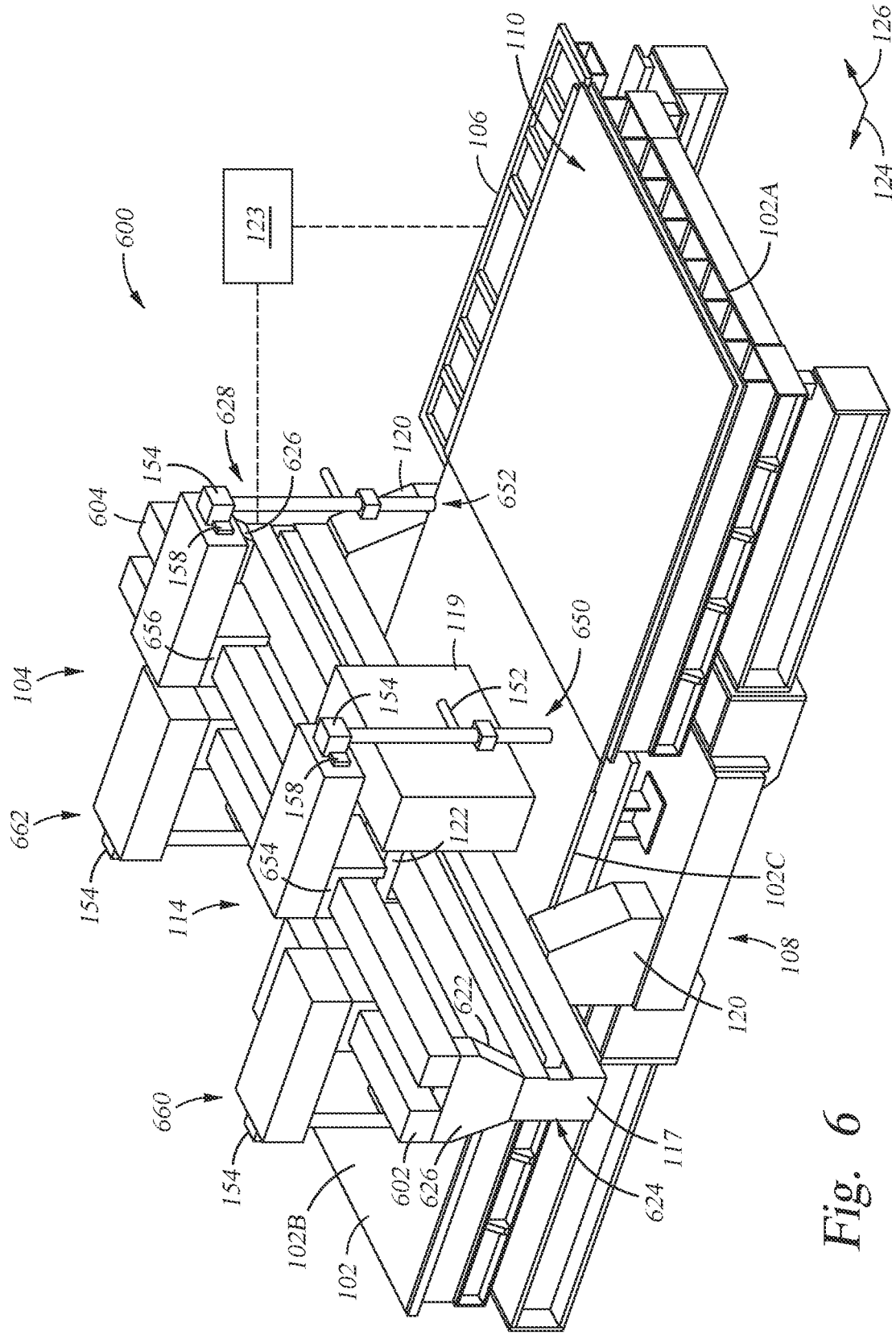
FIG. 6 is an isometric top view of a deposition device according to another embodiment.

FIG. 6 is an isometric top view of a deposition device according to another embodiment. The device of FIG. 6 is similar to the device of FIG. 1, with the difference that the imaging system 150 is absent. Instead, a first imaging system 650 is movably coupled to an imaging rail 604, which is part of a deposition assembly support 616. The deposition assembly support 616 is like the deposition assembly support 116 of FIG. 1, including the beam or rail 117, which is a deposition rail in this case. The deposition assembly support 616 include an extension 620 that supports a first imaging system 650 and a second imaging system 652. The extension 620 comprises a first riser 622 that extends from a first end 624 of the beam 117 and a second riser 626 that extends from a second end 628 of the beam 117 opposite from the first end 624. The extension 620 further comprises the imaging rail 604, which extends from the first riser 622 to the second riser 626, substantially parallel to the beam 117.

Each of the first imaging system 650 and the second imaging system 652 is substantially the same as the imaging system 150. The first imaging system 650 is coupled to the imaging rail 604 by a first imaging carriage 654. The second imaging system 652 is coupled to the imaging rail 604 by a second imaging carriage 656. The dispenser housing 119 is between the first imaging system 650 and the second imaging system 652. Each of the first imaging carriage 654 and the second imaging carriage 656 has a lateral extension that supports the first and second imaging systems 650 and 652 at a clearance from the imaging rail 604. The clearance allows each of the first and second imaging systems 650 and 652 to move along substantially the entire length of the imaging rail 604, with no interference from the deposition housing 119.

The device 600 has four independently movable imaging systems. The two imaging systems 650 and 652 described above are located on a first side of the deposition support assembly 616. The device 600 has a third imaging system 660 and a fourth imaging system 662, each of which is an imaging system like the imaging systems 650 and 652. Here, the imaging rail 604 is a first imaging rail, and a second imaging rail 664 is part of the deposition support assembly 616. The first and second imaging rails 604 and 664, in this case, are both disposed on the two risers 622 and 626, and extend parallel, each to the other, between the two risers 622 and 626. The imaging systems 660 and 662 are each supported on the second imaging rail 664 by an imaging carriage. Specifically, a third imaging carriage 674 couples with the second imaging rail 664 to support the third imaging system 660, and a fourth imaging carriage 676 couples with the second imaging rail 664 to support the fourth imaging system 662. A space between the imaging rails 604 and 664 allows the first and second carriages 654 and 656 to move along the first imaging rail 604 without interference from the third and fourth carriages 674 and 676. In this way, all four imaging systems can be positioned along substantially the entire length of the deposition support assembly 616. Use of multiple imaging systems allows for a high volume of images to be captured in a smaller time, thus speeding up processes that depend on such imaging.

Any number of the imaging systems described herein can be used with such a device. In FIG. 6, four imaging systems are illustrated, but any number of such imaging systems can be used. For example, two imaging systems can be used on one of the two imaging rails, or two imaging systems can be used, one on each imaging rail. Imaging systems can be added to one or both imaging rails by merely placing the carriage of an imaging system on the desired imaging rail. In some cases, the carriages couple to the imaging rails using air bearings, so the air bearing of the added imaging system can be activated to allow the added imaging system to move along the chosen imaging rail. Deploying a plurality of imaging systems that use LED light sources allows a device to use the brightness, uniformity, and fast pulse time of LED radiation to image a plurality of locations simultaneously, thus increasing the speed of imaging various portions of a substrate. Using multiple imaging devices can also increase precision of imaging at a single location on the substrate if two or more images of the location are acquired and compared.

While the foregoing is directed to embodiments of the present invention, other and further embodiments of the present disclosure may be devised without departing from the basic scope thereof, and the scope thereof is determined by the claims that follow.

What is claimed is:

1. A deposition device, comprising:
   a substrate support; and
   a deposition assembly disposed across the substrate support, the deposition assembly comprising:
      a rail extending between supports located on opposite sides of the substrate support;
      a dispenser assembly movably coupled to the rail; and
      an imaging system coupled to the rail, the imaging system comprising an LED light source coupled to an optical assembly to direct radiation from the LED light source toward the substrate support and to capture radiation reflected from the substrate support.

2. The deposition device of claim 1, wherein the dispenser assembly houses the imaging system.

3. The deposition device of claim 1, wherein the imaging system comprises an array of LEDs having an emission wavelength of at least about 600 nm.

4. The deposition device of claim 3, wherein the imaging system further comprises an imaging unit having a sensitivity profile matched to the emission wavelength of the LEDs.

5. The deposition device of claim 4, wherein the LED light source has a pulse duration of 1 μsec or less.

6. The deposition device of claim 5, further comprising a controller configured to scan a substrate positioned on the substrate support relative to the imaging system, activate the imaging unit for an imaging time, and activate the LED light source for an active time, wherein the active time is encompassed by the imaging time.

7. The deposition device of claim 6, wherein the LED light source is coupled to a fiber waveguide.

8. The deposition device of claim 1, wherein the imaging system is one imaging system among a plurality of imaging systems coupled to the deposition assembly, each imaging system of the plurality of imaging systems comprising an LED light source.

9. A deposition device, comprising:
   a substrate support; and
   a deposition assembly comprising an imaging system disposed across the substrate support, the imaging system comprising:
      an LED light source fiber coupled to an optical assembly to direct radiation from the LED light source toward the substrate support; and
      an imaging unit disposed to capture radiation reflected through the optical assembly.

10. The deposition device of claim 9, further comprising a position controller to position the imaging system.

11. The deposition device of claim 9, wherein the dispenser assembly houses the imaging system.

12. The deposition device of claim 9, wherein the imaging unit has a sensitivity profile matched to the emission wavelength of the LED light source.

13. The deposition device of claim 9, further comprising a controller configured to scan a substrate positioned on the substrate support relative to the imaging system, activate the imaging unit for an imaging time, and activate the LED light source for an active time, wherein the active time is encompassed by the imaging time.

14. The deposition device of claim 13, wherein each of the controller and the LED light source is configured for a pulse duration of 1 μsec or less.

15. A deposition device, comprising:
   a gas cushion substrate support;
   a deposition assembly comprising an imaging system disposed across the substrate support, the imaging system comprising:
      an LED light source fiber coupled to an optical assembly to direct radiation from the LED light source toward the substrate support; and
      an imaging unit disposed to capture radiation reflected through the optical assembly; and
   a controller configured to relatively move the deposition assembly and a substrate disposed on the substrate support and to activate the imaging system to capture an image of a portion of the substrate during the relative movement.

16. The deposition device of claim 15, wherein the imaging unit has a sensitivity profile matched to the emission wavelength of the LED light source.

17. The deposition device of claim 15, wherein the dispenser assembly houses the imaging system.

18. The deposition device of claim 15, wherein each of the controller and the LED light source is configured for a pulse duration of 1 μsec or less.

19. The deposition device of claim 18, wherein the controller is configured to activate the LED light source when a feature to be imaged is expected to be within a field of view of the imaging unit.

\* \* \* \* \*